US008975624B2

(12) United States Patent
Yamakita et al.

(10) Patent No.: US 8,975,624 B2
(45) Date of Patent: Mar. 10, 2015

(54) ORGANIC ELECTROLUMINESCENCE DISPLAY PANEL AND DISPLAY DEVICE

(75) Inventors: Hiroyuki Yamakita, Osaka (JP);
Kenichi Masumoto, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/113,264

(22) PCT Filed: Jul. 19, 2011

(86) PCT No.: PCT/JP2011/004077
§ 371 (c)(1),
(2), (4) Date: Oct. 22, 2013

(87) PCT Pub. No.: WO2013/011540
PCT Pub. Date: Jan. 24, 2013

(65) Prior Publication Data
US 2014/0042424 A1     Feb. 13, 2014

(51) Int. Cl.
*H01L 29/08*     (2006.01)
*H01L 35/24*     (2006.01)
*H01L 51/00*     (2006.01)
*H01L 27/32*     (2006.01)
(Continued)

(52) U.S. Cl.
CPC ........ *H01L 27/3272* (2013.01); *H01L 27/3211* (2013.01); *H05B 33/22* (2013.01); *H01L 51/529* (2013.01); *H01L 51/5284* (2013.01); *H01L 27/3246* (2013.01); *H01L 2251/5315* (2013.01); *H01L 2251/568* (2013.01)
USPC .................................... 257/40; 257/E51.022

(58) Field of Classification Search
USPC ........................................... 257/40, E51.022
See application file for complete search history.

(56) References Cited

U.S. PATENT DOCUMENTS 5,818,168 A * 10/1998 Ushifusa et al. ............... 313/582
6,380,673 B1 * 4/2002 Sekiya et al. .................. 313/504
6,429,584 B2 * 8/2002 Kubota ......................... 313/504

(Continued)

FOREIGN PATENT DOCUMENTS

JP     2006-221875     8/2006
JP     2006-236744     9/2006

(Continued)

OTHER PUBLICATIONS

International Search Report (ISR) in International Application No. PCT/JP2011/004077, dated Sep. 20, 2011.

*Primary Examiner* — Ida M Soward
(74) *Attorney, Agent, or Firm* — Greenblum & Bernstein, P.L.C.

(57) ABSTRACT

The present application discloses OEL display panel including OEL board including organic emission elements situated in respective emission regions compartmentalized by confining wall, and black matrix facing OEL board. The black matrix is provided with openings, each of which allows passage of light from each of the organic emission elements. Organic emission elements include first organic emission element with organic emission layer for emitting light in first emission color, and second organic emission element with organic emission layer for emitting light in second emission color different from first emission color. Openings include first opening corresponding to first organic emission element, and second opening corresponding to second organic emission element. First organic emission element has lower emission efficiency than second organic emission element does. Thermal conductivity is higher around first opening than second opening.

19 Claims, 15 Drawing Sheets

(51) Int. Cl.
*H05B 33/22* (2006.01)
*H01L 51/52* (2006.01)

(56) References Cited

U.S. PATENT DOCUMENTS

| | | | | |
|---|---|---|---|---|
| 7,375,464 | B2* | 5/2008 | Chin et al. | 313/506 |
| 7,952,276 | B2* | 5/2011 | Lee et al. | 313/512 |
| 8,450,914 | B2* | 5/2013 | Gyoda | 313/45 |
| 8,841,833 | B2* | 9/2014 | Higo et al. | 313/504 |
| 2006/0158095 | A1* | 7/2006 | Imamura | 313/500 |
| 2008/0224594 | A1* | 9/2008 | Takagi et al. | 313/498 |
| 2009/0072724 | A1* | 3/2009 | Seki et al. | 313/504 |
| 2010/0156273 | A1* | 6/2010 | Utsunomiya et al. | 313/498 |
| 2012/0299035 | A1* | 11/2012 | Ikeda et al. | 257/91 |
| 2013/0337607 | A1* | 12/2013 | Yamazaki et al. | 438/104 |

FOREIGN PATENT DOCUMENTS

| | | |
|---|---|---|
| JP | 2006-244847 | 9/2006 |
| JP | 2008-077859 | 4/2008 |
| JP | 2008-243650 | 10/2008 |

* cited by examiner

ORGANIC ELECTROLUMINESCENCE DISPLAY PANEL AND DISPLAY DEVICE

TECHNICAL FIELD

The present application relates to an organic EL display panel, which uses organic EL (electroluminescence) to display images, and a display device including the organic EL display panel.

BACKGROUND

Organic EL display panels which utilize organic EL to display images are used for various display devices such as mobile phones, television sets and alike. The organic EL display panels which use organic emission elements are superior in terms of ability to display high quality images and lightweight. On the other hand, it may be a problem for the organic EL display panels that the organic emission elements are likely to deteriorate because of internal heat generation in the organic EL display panels. The deterioration of the organic emission elements results in decreased luminance and a shorter life time of the organic emission elements.

There have been various proposals to overcome the drawback resulting from the internal heat generation in the organic EL display panels.

Patent Document 1 teaches endothermic materials loaded into a black matrix. Heat generated in an organic EL display panel is absorbed by the endothermic materials.

The disclosed technologies in Patent Document 1 fail to emit the heat from the inside of the organic EL display panel to the outside. Therefore, an endothermic amount depends on heat capacity of the endothermic materials. Heat exceeding the heat capacity degrades the organic emission elements. Accordingly, the technologies of Patent Document 1 are insufficient to prevent the organic emission elements from deteriorating.

Patent Documents 2 and 3 disclose technologies to use a thermally conductive layer which transmits heat generated in an organic EL display panel toward the outside of the organic EL display panel. Unlike the disclosed technologies of Patent Document 1, the thermally conductive layer facilitates to release heat in the organic EL display panel toward the outside according to the disclosed technologies of Patent Documents 2 and 3.

The disclosed technologies of Patent Document 2 and 3 require high quality of the thermally conductive layer. If the thermally conductive layer has low thermal conductivity, thermal dissipation from the organic EL display panel becomes insufficient. In general, the thermally conductive layer with high quality is expensive.

The disclosed technologies above address absorption and conduction of heat throughout an organic EL display panel.

Patent Document 1: JP 2008-77859 A
Patent Document 2: JP 2006-221875 A
Patent Document 3: JP 2006-244847 A

SUMMARY

The present invention aims to provide an organic EL display panel, which exerts thermal conductance characteristics suitable for characteristics of organic emission elements used as pixels of the organic EL display panel to suppress deterioration of the organic emission elements effectively, and a display device having the organic EL display panel.

An organic EL display panel according to one aspect of the present invention has an organic EL board including organic emission elements which are situated in respective emission regions compartmentalized by a confining wall, and a black matrix which faces the organic EL board. The black matrix is provided with openings, each of which allows passage of light from each of the organic emission elements. The organic emission elements include a first organic emission element with an organic emission layer configured to emit light in first emission color, and a second organic emission element with an organic emission layer configured to emit light in second emission color which is different from the first emission color. The openings include a first opening in correspondence to the first organic emission element, and a second opening in correspondence to the second organic emission element. The first organic emission element has lower emission efficiency than the second organic emission element does. Thermal conductivity is higher around the first opening than the second opening.

An organic EL display panel according to another aspect of the present invention has organic emission elements, which are situated in respective emission regions compartmentalized by a confining wall, and a thermally conductive layer formed on the confining wall. The organic emission elements include a first organic emission element with an organic emission layer configured to emit light in first emission color, and a second organic emission element with an organic emission layer configured to emit light in second emission color which is different from the first emission color. The thermally conductive layer is loaded with thermally conductive materials. The thermally conductive layer includes a first region closer to the first organic emission element than the second organic emission element, and a second region closer to the second organic emission element than the first organic emission element. A filling rate of the thermally conductive materials is higher in the first region than the second region.

A display panel according to yet another aspect of the present invention includes the aforementioned organic EL display panel.

The aforementioned organic EL display panels and display device may exert thermal conductance characteristics suitable for characteristics of organic emission elements to suppress deterioration of the organic emission elements effectively.

The object, features and advantages of the present invention will become more apparent based on the ensuing detailed explanation and appended drawings.

DETAILED DESCRIPTION

Figure 1:
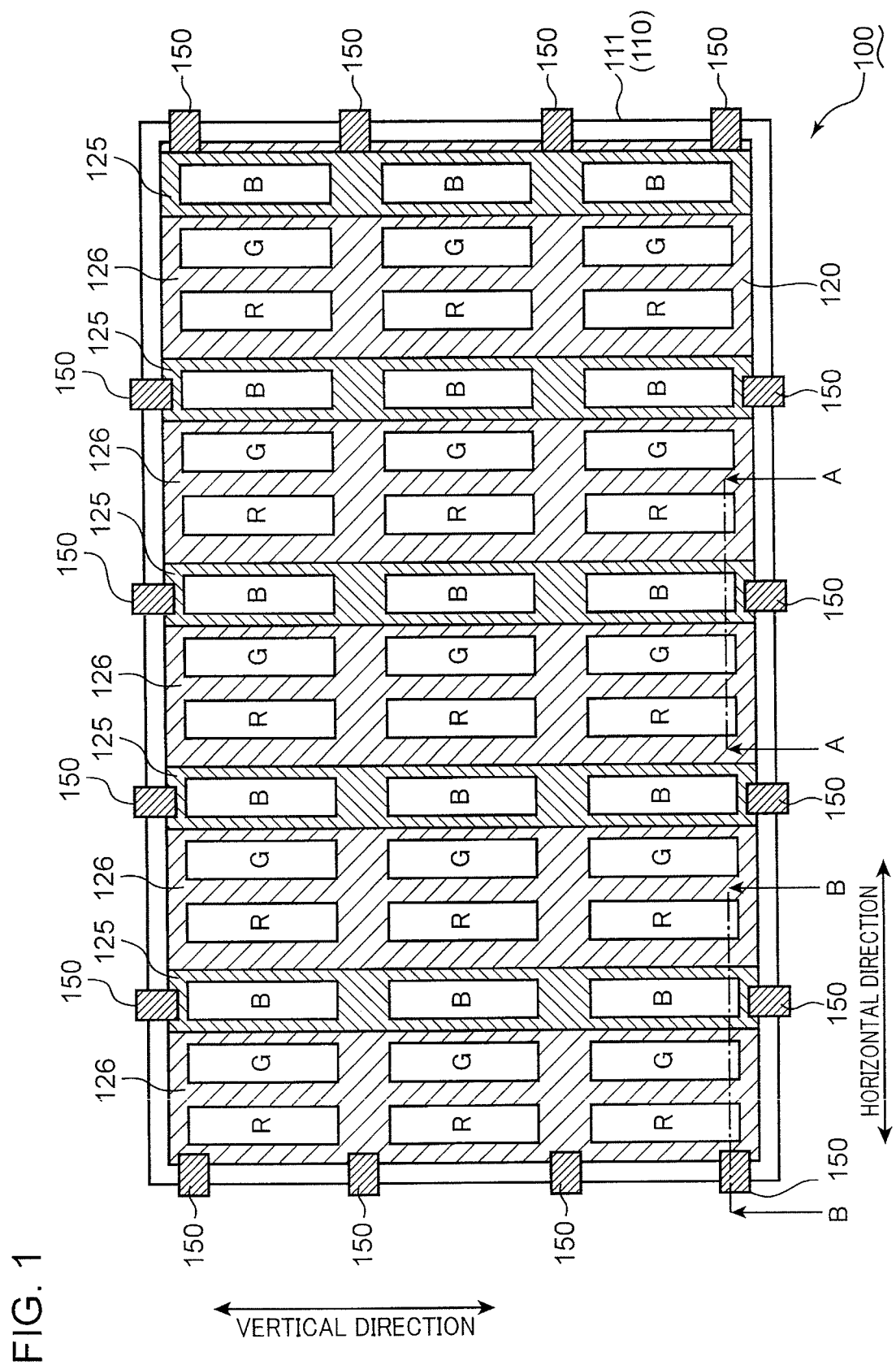
FIG. 1 is a schematic plan view of a display panel (organic EL display panel) according to the first embodiment.

Organic display panels and display devices according to various embodiments are described with reference to drawings below. It should be noted that similar numerals are assigned to similar components in the following embodiments. For descriptive clarification, redundant descriptions are omitted as appropriate. Configurations, arrangements and shapes shown in the drawings and their relevant descriptions aim only to make principles of the organic display panels and display devices easily understood. Therefore, the principles of the organic display panels and display devices are not limited to them.

<Principles of Heat Generation>

Structures to exert thermal conductance characteristics suitable for heat generation characteristics of pixels of an organic EL display panel (referred to as display panel, hereinafter) are described in a series of the following embodiments. It is difficult to measure how heat generation characteristics of an individual pixel affect a heat distribution over the entire display panel by means of general IR measurement technologies using infrared light. However, the present inventors executed various experiments on the basis of simulation models, and figured out that each of organic emission elements working as a heat source affects the heat distribution over the entire display panel.

According to the experiments on the basis of the simulation models of the present inventors, there is lower emission efficiency but higher temperature band in a region, in which an organic emission element is situated to emit light in blue, than other regions, in which other organic emission elements are situated to emit light in other hues. Therefore, it is figured out from this fact that a conversion ratio to light is lower from electric energy of a current applied to an organic emission element with low emission efficiency than another organic emission element with high emission efficiency whereas a conversion ratio to heat is higher from electric energy of a current applied to the organic emission element with low emission efficiency than the other organic emission element with high emission efficiency.

On the basis of the aforementioned knowledge, a thermally conductive layer may not have to be provided evenly over a display panel as a whole. Various structures to enhance thermal conductivity specifically around organic emission elements with low emission efficiency are described in a series of the following embodiments. It should be noted that noticeable differences in a temperature distribution were not identified as a conclusion of comparison between these structures and conventional structures in which thermal conductivity is enhanced entirely over a display panel.

<First Embodiment>

(Structure of Organic EL Display Panel)

Figure 2:
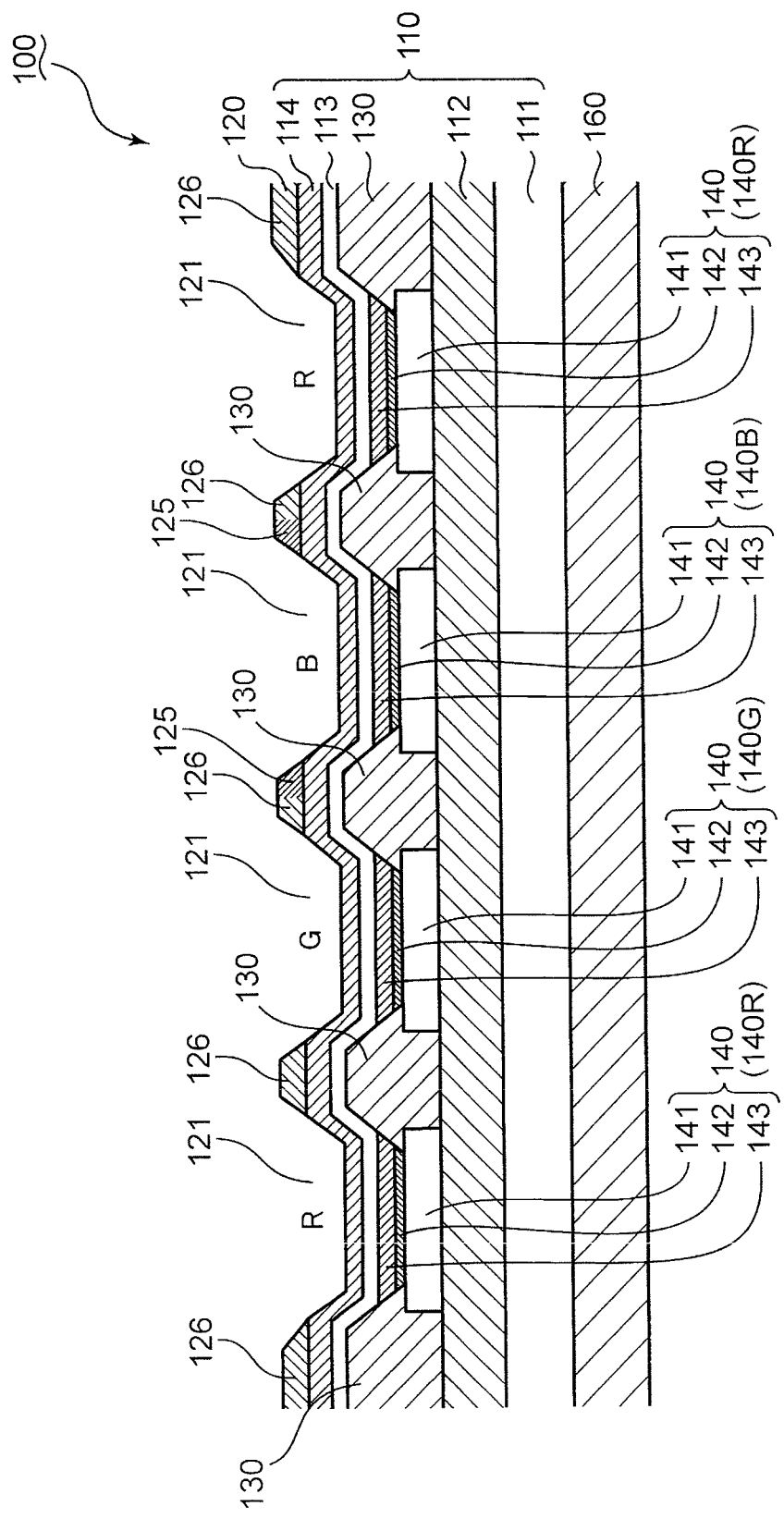
FIG. 2 is a schematic cross-sectional view along the A-A line shown in FIG. 1.
Figure 3:
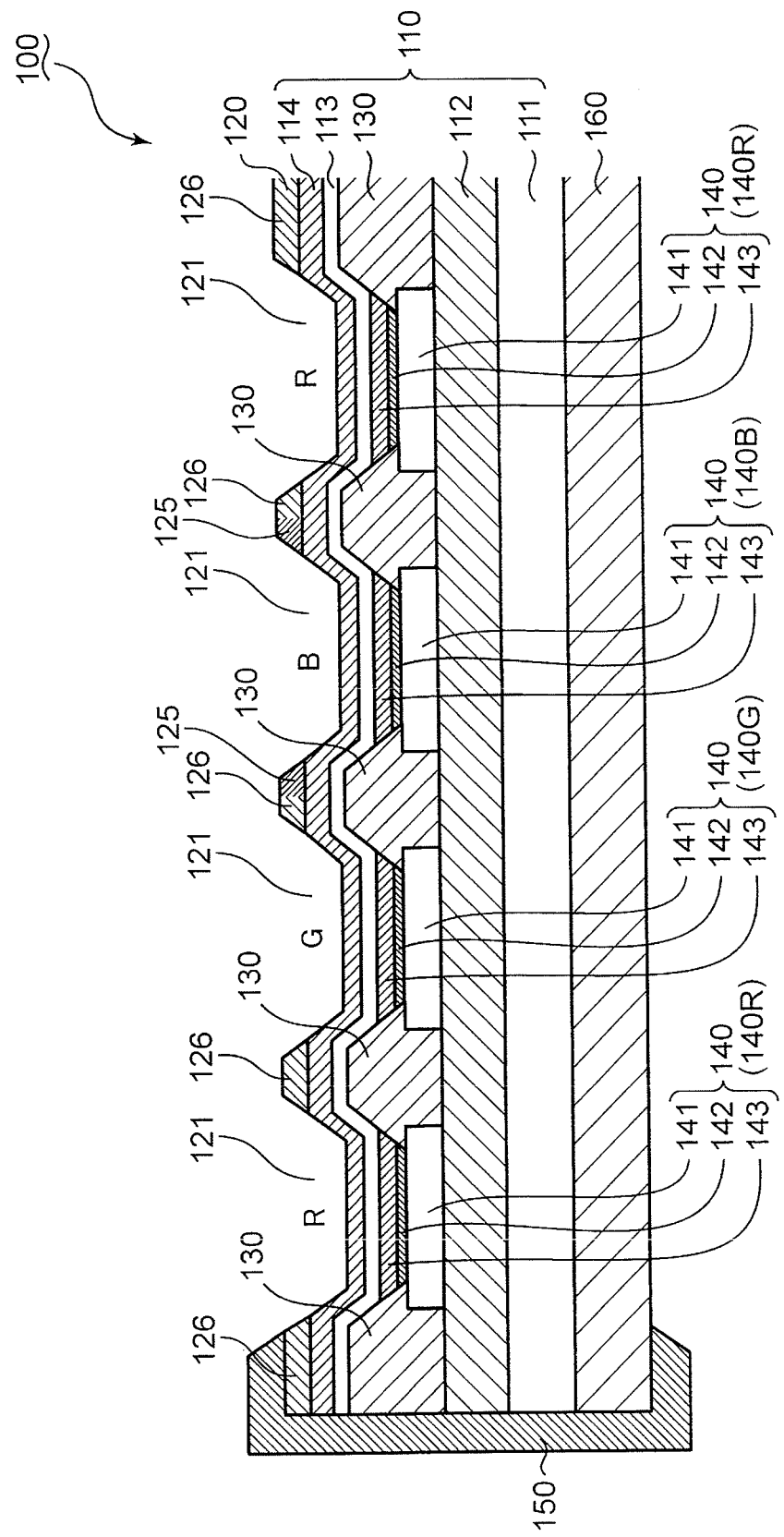
FIG. 3 is a schematic cross-sectional view along the B-B line shown in FIG. 1.

FIG. 1 is a schematic plan view of an organic EL display panel (display panel 100) according to the first embodiment. FIG. 2 is a schematic cross-sectional view along the A-A line shown in FIG. 1. FIG. 3 is a schematic cross-sectional view along the B-B line shown in FIG. 1. The display panel 100 is described with reference to FIGS. 1 to 3.

The display panel 100 includes an organic EL board 110 and a black matrix 120 which faces the organic EL board 110. The organic EL board 110 includes a TFT board 111, on which TFT elements and driver circuits are formed, and a planarizing layer 112 to planarize a surface of the TFT board 111. The organic EL board 110 further includes organic emission elements 140 and banks 130, which are formed on the planarizing layer 112 laminated on the TFT board 111.

In the following description, the direction along the A-A line in FIG. 1 is referred as to the horizontal direction. The direction perpendicular to the A-A line is referred as to the vertical direction. It should be noted that these directional definitions do not restrict principles of the present embodiment. As shown in FIGS. 2 and 3, the banks 130 and the organic emission elements 140 are arranged one after the other in the horizontal direction. Each of the organic emission elements 140 includes a reflective anode 141 laminated on the planarizing layer 112, a hole-injection layer 142 for receiving holes from the reflective anode 140, and an organic emission layer 143 which emits light due to coupling of holes with electrons.

The organic emission elements 140 on the planarizing layer 112 include a blue emission element 140B configured to emit light in blue, a red emission element 140R configured to emit light in red and a green emission element 140G configured to emit light in green. The emission colors of the organic emission elements 140 are determined by materials used for the organic emission layers 143. The organic emission layer 143 of the blue emission element 140B emits light in blue. The organic emission layer 143 of the red emission element 140R emits light in red. The organic emission layer 143 of the green emission element 140G emits light in green. In the present embodiment, the blue emission element 140B is exemplified as the first organic emission element. The red or green emission element 140R, 140G is exemplified as the second organic emission element. The green emission element 140G is also exemplified as the third emission element. The hue of blue is exemplified as the first emission color. The hue of red or green is exemplified as the second emission color. The hue of green is also exemplified as the third emission color.

The blue emission element 140B has lower emission efficiency than the red or green emission element 140R, 140G does. Therefore, the blue emission element 140B and its periphery region are likely to become a higher temperature than the red and green emission elements 140R, 140G and their periphery region are, as described above.

The banks 130 surrounding the respective organic emission elements 140 define substantially rectangular spaces opened upward. The hole-injection layer 142 and the organic emission layer 143 are laminated in the space surrounded by the banks 130. The region represented by the symbol "R" in FIGS. 1 to 3 means a region configured to emit light in red (referred to as red emission region, hereinafter). The region represented by the symbol "G" means a region configured to emit light in green (referred to as green emission region, hereinafter). The region represented by the symbol "B"

means a region configured to emit light in blue (referred to as blue emission region, hereinafter). Lights from the red, green and blue emission elements 140 R, 140G, 140B is emitted outside the display panel 100 through the emission regions compartmentalized by the banks 130. Accordingly, viewers may observe images. Thus, the banks 130 define pixels of the display panel 100. In the present embodiment, the banks 130 are exemplified as the confining wall.

In the present embodiment, the red, green and blue emission regions are formed periodically in the horizontal direction. Each of the red, green and blue emission regions is aligned straight in the vertical direction (c.f. FIG. 1). Alternatively, other arrangements of the red, green and blue emission regions may be adopted. The principles of the present embodiment are not limited by arrangement patterns of the red, green and blue emission regions.

In the present embodiment, the display panel 100 displays images by means of light emission in the red, green and blue emission regions. Alternatively, other regions configured to emit light in different hues may be used to render images. For example, a display panel may use a region, which emits light in white in addition to the three primary color of RGB, to display images. The principles of the present embodiment are not limited by kinds or numbers of emission colors.

The organic EL board 110 includes an electronic transport layer 113, which is formed on the banks 130 and the organic emission elements 140, and a transparent cathode 114 formed on the electronic transport layer 113. Currents flow the organic emission layers 143 due to a voltage applied between the transparent cathode 114 and the reflective anode 141, so that the organic emission layers 143 emit light.

The black matrix 120 formed on the banks 130 is provided with openings 121, which correspond to the red, green and blue emission regions, respectively. Lights emitted from the organic emission layers 143 in the red, green and blue emission regions pass through the openings 121, and are irradiated outside the display panel 100. In the present embodiment, the opening 121 in correspondence to the blue emission region, in which the blue emission element 140B is situated, is exemplified as the first opening. The opening 121 in correspondence to the red or green emission region, in which the red or green emission element 140R, 140G is situated, is exemplified as the second opening. The opening 121 in correspondence to the green emission region, in which the green emission element 140G is situated, is also exemplified as the third opening.

The black matrix 120 includes a first conductive region 125 formed around the blue emission region, and a second conductive region 126 formed around the red and green emission regions. The first conductive region 125 is closer to the blue emission region, in which the blue emission element 140B is situated, than the red and/or green emission regions, in which the red and/or green emission elements 140R, 140G are situated. The second conductive region 126 is closer to the red or green emission region, in which the red or green emission element 140R, 140G is situated, than the blue emission region, in which the blue emission element 140B is situated. Thermal conductivity is higher in the first conductive region 125 around the opening 121 in correspondence to the blue emission region than the second conductive region 126 around the openings, which correspond to the red and green emission regions, respectively. In the present embodiment, the first conductive region 125 is exemplified as the first region. The second conductive region 126 is exemplified as the second region.

The first conductive region 125 is loaded with thermally conductive materials which have high thermal conductivity. Optionally, the second conductive region 126 may be also loaded with thermally conductive materials. It should be noted that a filling rate of the thermally conductive materials is set to a higher level in the first conductive region 125 than the second conductive region 126.

It is preferable if the thermal conductivity of the thermally conductive materials is no less than 1,000 W/m·K. Carbon nanotubes are exemplified as materials with such high thermal conductivity. The carbon nanotubes have thermal conductivity no less than around 2,000 W/m·K.

As shown in FIG. 1, the display panel 100 further includes substantially C-shaped contact members 150 configured to clamp peripheries of the organic EL board 110 and the black matrix 120. It is preferable if the contact member 150 is formed from a material with high thermal conductivity such as aluminum or copper. In the present invention, the contact members 150 are arranged intermittently along the peripheries of the organic EL board 110 and the black matrix 120. It should be noted that some of the contact members 150 are preferably arranged in contact with the first conductive region 125.

As shown in FIG. 2, the display panel 100 further includes a radiation layer 160 attached to the TFT board 111. The TFT board 111 is situated between the radiation layer 160 and the planarizing layer 112. The radiation layer 160 appearing on an outer surface of the display panel 100 may be, for example, formed from a graphite sheet.

As shown in FIG. 3, one end of the contact member 150 is in contact with the black matrix 120. The other end of the contact member 150 is in contact with the radiation layer 160. The contact member 150 in contact with the first conductive region 125 effectively conducts heat from the first conductive region 125 to the radiation layer 160. The radiation layer 160 emits the heat outside the display panel 100. Thus, a temperature rise of the display panel 100 is suppressed effectively. In the present invention, the contact member 150 and the radiation layer 160 are exemplified as the heat dissipater.

Figure 4:
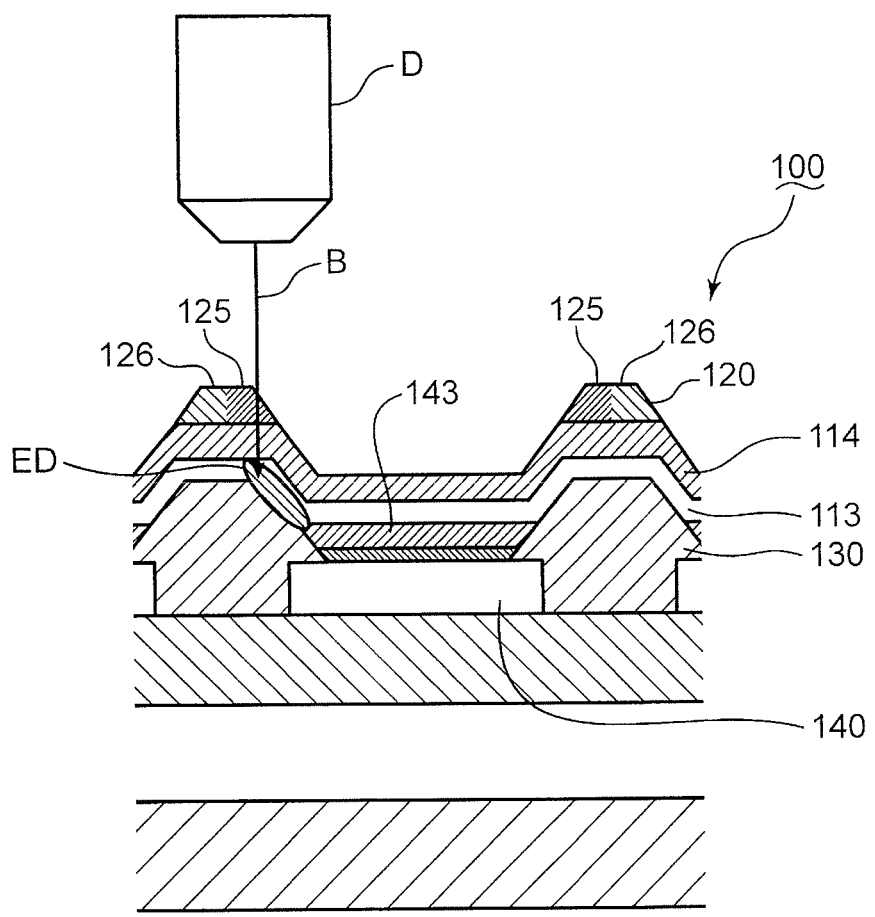
FIG. 4 is a schematic cross-sectional view of the display panel shown in FIG. 1.

FIG. 4 is a schematic cross-sectional view of the display panel 100. The black matrix 120 is further described with reference to FIG. 4.

A part of a laser device D for repair, a laser beam B emitted from the laser device D and a foreign object ED interposed between the transparent cathode 114 and the bank 130 (i.e. in the electronic transport layer 113) are shown in FIG. 4. At this moment, an electric conduction path is formed between the transparent cathode 114 and the organic emission layer 143 via the foreign object ED to prevent the organic emission layer 143 from good emission. In this embodiment, the black matrix is situated near the organic emission layer 140. Therefore, laser repair may be executed to remove the foreign object ED through the first conductive layer 125.

A filling rate of thermally conductive materials loaded into the first conductive region 125 of the black matrix 120 may be adjusted so as to allow passage of the laser beam B for repair. In particular, the filling rate may be, for example, 20-30% in volumetric ratio. This allows arrival of the laser beam B emitted from the laser device D at the foreign object ED through the first conductive region 125 of the black matrix 120 and the transparent cathode 114, so that the laser beam B burns off the foreign object ED. Accordingly, the electric conduction path formed by the foreign object ED is removed to achieve appropriate current supply to the organic emission layers 143. Thus, the foreign object ED causing dark spot pixels is appropriately removed. In the present embodiment, the first conductive region 125 configured to allow passage of the laser beam B under adjustment to the aforementioned filling rate is exemplified as the allowance region.

(Formation of Black Matrix)

Figure 5:
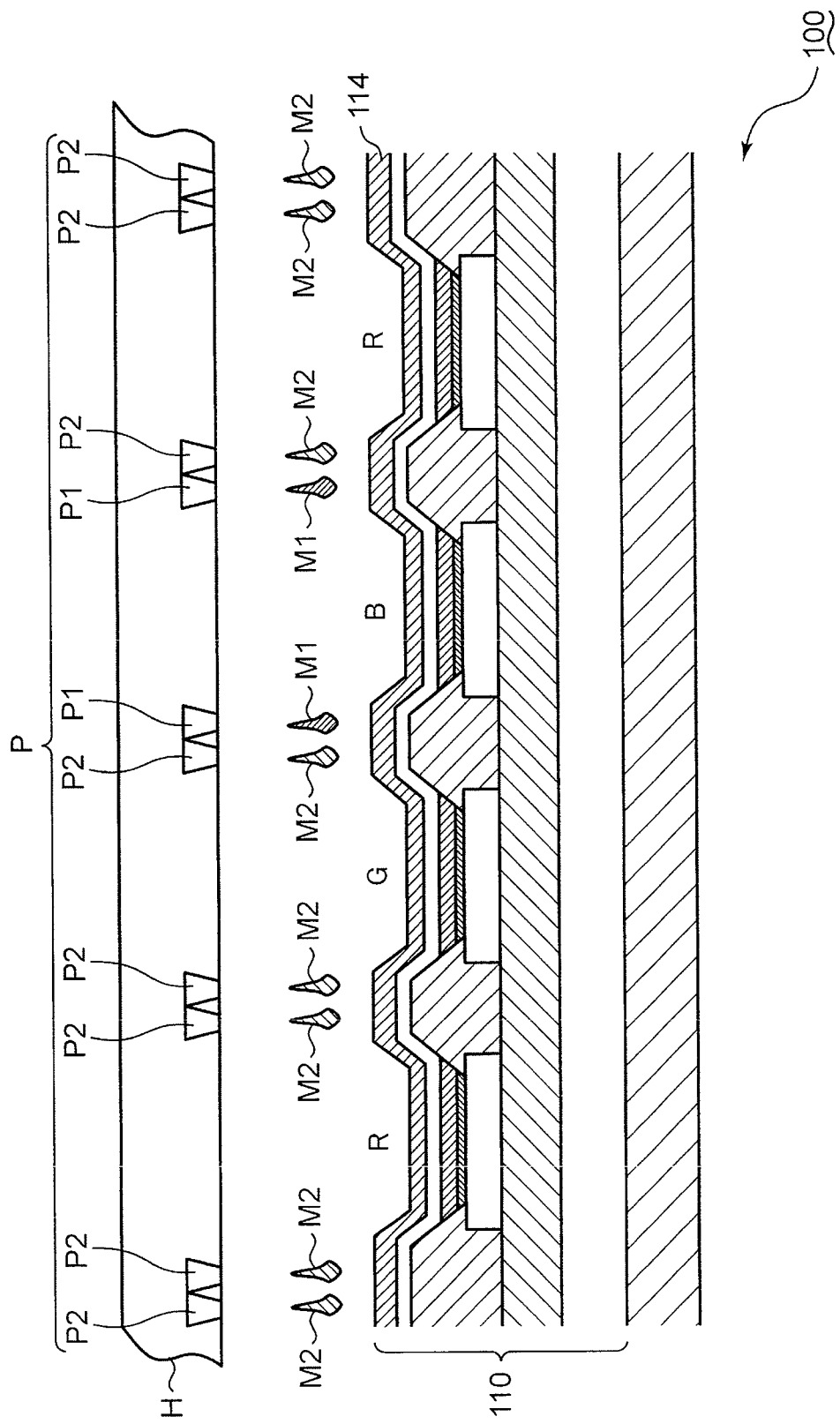
FIG. 5 is a schematic view showing a formation process of a black matrix of the display panel depicted in FIG. 1.

FIG. 5 is a schematic view of a formation process of the black matrix 120. The formation process of the black matrix 120 is described with reference to FIGS. 1 and 5.

In the present embodiment, an inkjet device is used to form the black matrix 120 on the organic EL board 110. FIG. 5 shows a head H of the inkjet device.

The head H is provided with discharge apertures P, from which graphite resin materials are discharged to form the black matrix 120. The discharge apertures P include a first discharge aperture P1 to form the first conductive region 125 of the black matrix 120 and a second discharge aperture P2 to form the second conductive region 126 of the black matrix 120. Materials with high thermal conductivity (e.g. carbon nanotubes) are contained in graphite materials M1 of the black matrix 120 discharged from the first discharge aperture P1 than graphite materials M2 of the black matrix 120 discharged from the second discharge aperture P2. Therefore, thermal conductivity is higher in the first conductive region 125 around the blue emission region than the second conductive region 126 around the red and green emission regions.

In order to complete the display panel 100, a facing board (not shown) is placed after the graphite resin materials M1, M2 cure on the transparent cathode 114 to form the black matrix 120.

(Simulation)

Figure 6:
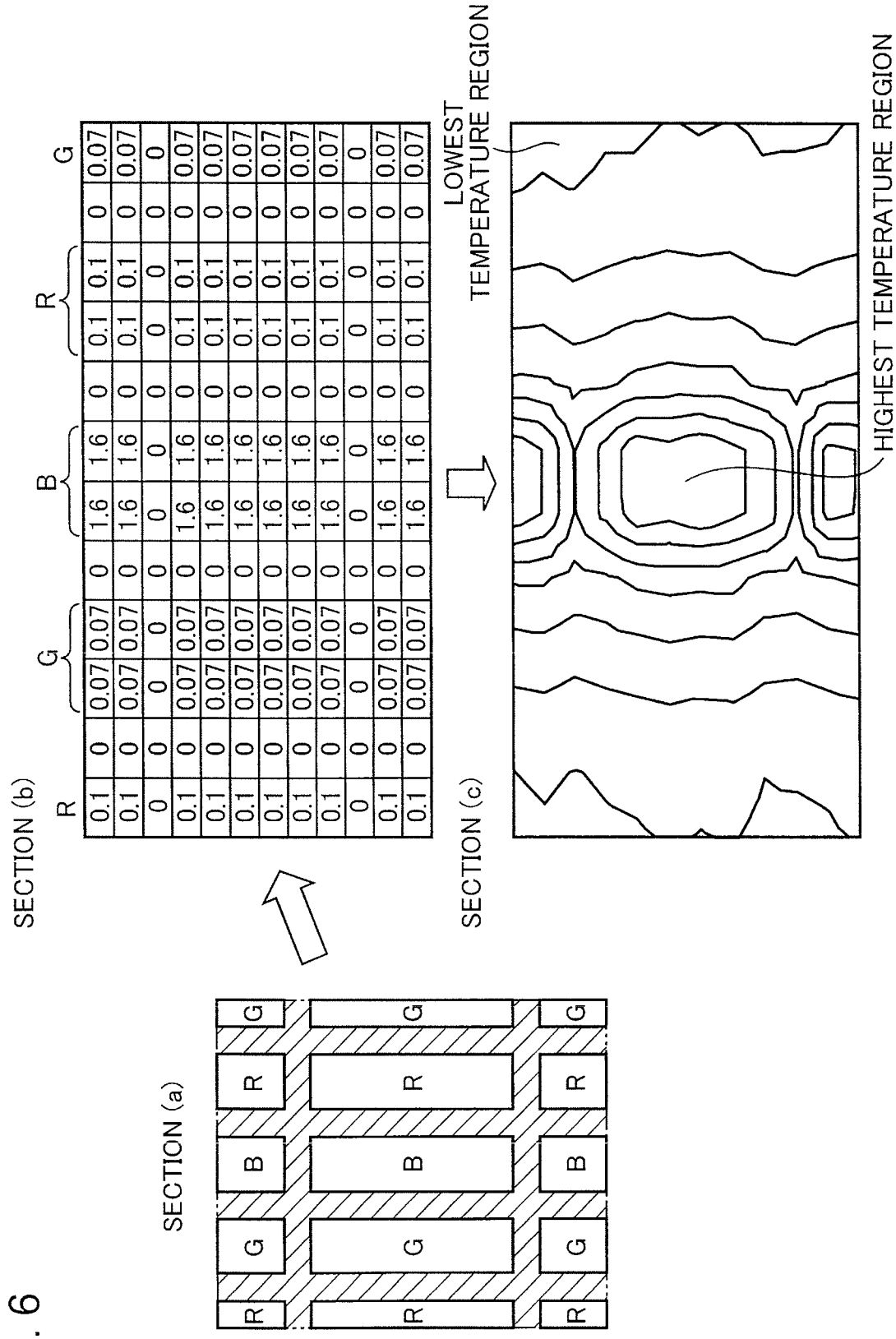
FIG. 6 is a schematic view of a simulation about a temperature distribution on a display panel including a black matrix which is formed from graphite resin materials without high thermally-conductive materials such as carbon nanotubes.
Figure 7:
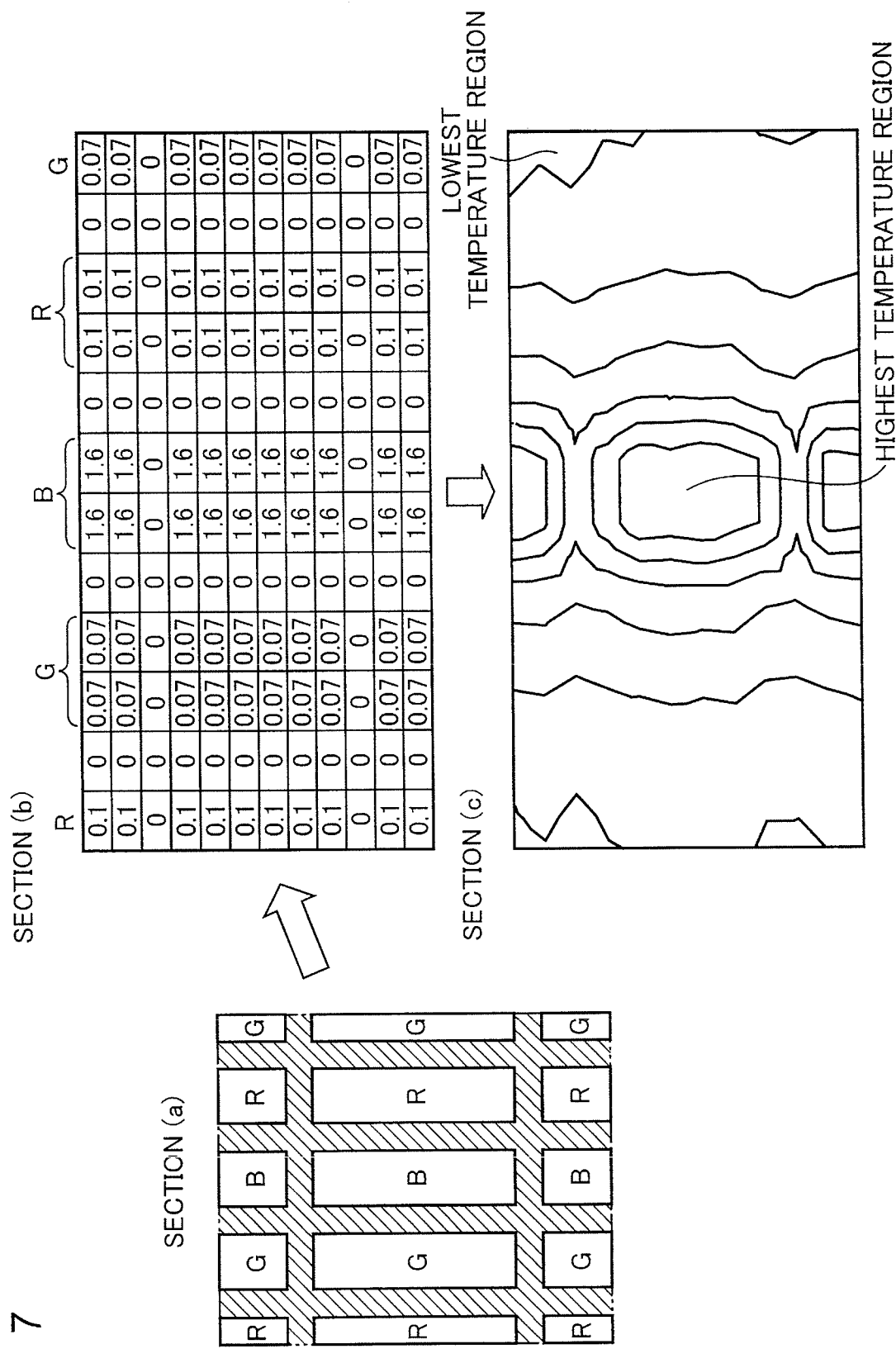
FIG. 7 is a schematic view of a simulation about a temperature distribution on a display panel including a black matrix over which carbon nanotubes are wholly distributed.
Figure 8:
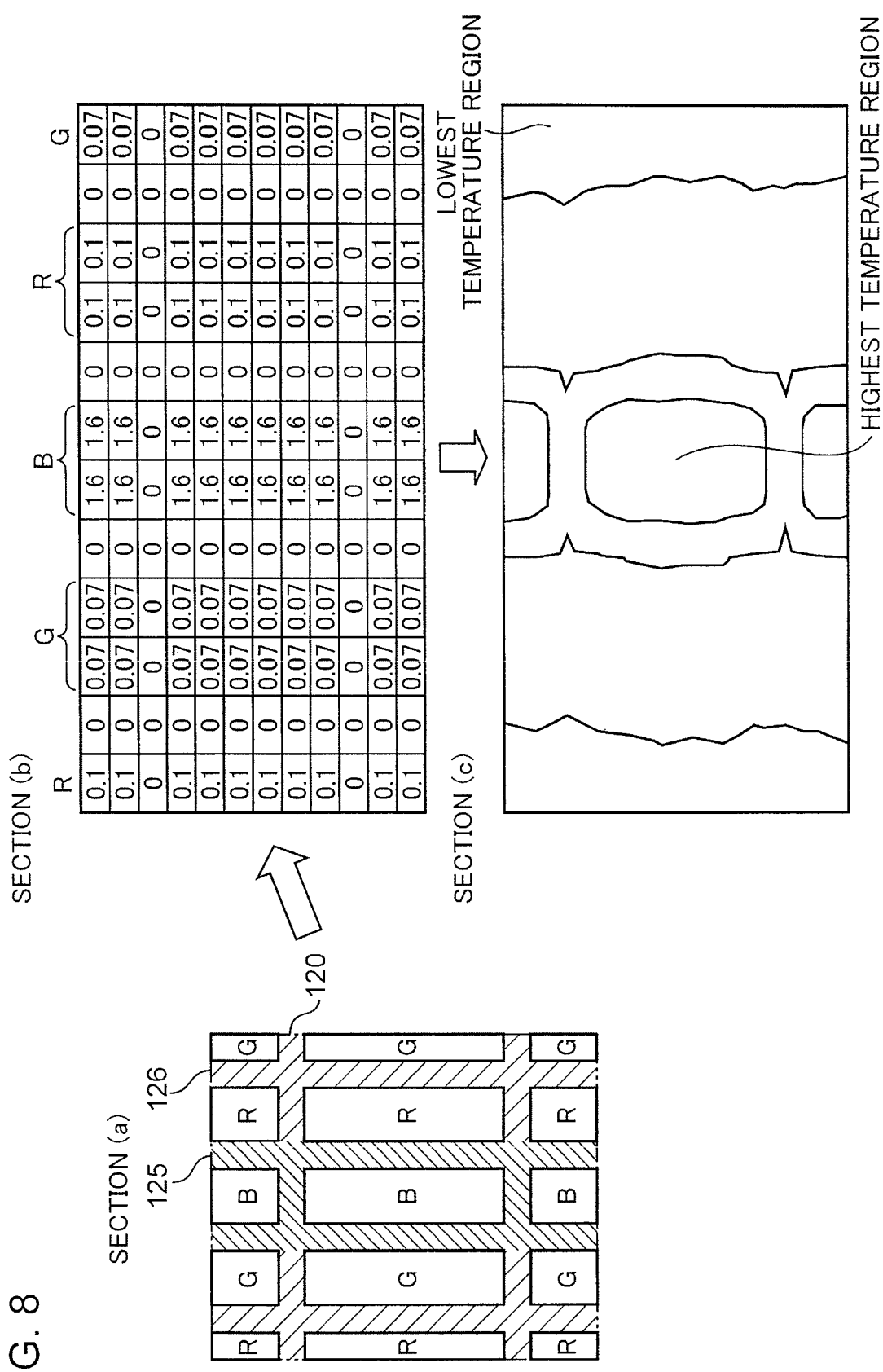
FIG. 8 is a schematic view of a simulation about a temperature distribution on the display panel shown in FIG. 1.

FIG. 6 shows a schematic view of a simulation about a temperature distribution on a display panel which includes a black matrix formed from a graphite resin without any materials of high thermal conductivity such as carbon nanotubes. FIG. 7 shows a schematic view of a simulation about a temperature distribution on a display panel including a black matrix over which carbon nanotubes are distributed entirely. FIG. 8 shows a schematic view of a simulation about a temperature distribution on the display panel 100 according to the present embodiment. It should be noted that the black matrices shown in FIGS. 6 and 7 are disconnected from a heat dissipater whereas the black matrix 120 shown in FIG. 8 is connected to the heat dissipater (the contact member 150 and the radiation layer 160) as described above. The simulations about temperature distributions are described with reference to FIGS. 6 to 8.

Sections (a) of FIGS. 6 to 8 are schematic plan views of the black matrices. The black matrix shown in the section (a) of FIG. 6 has low thermal conductivity as a whole. The black matrix shown in the section (a) of FIG. 7 has high thermal conductivity as a whole. The first conductive region 125 of the black matrix 120 shown in the section (a) of FIG. 8 has thermal conductivity equivalent to the thermal conductivity of the black matrix shown in the section (a) of FIG. 7. The second conductive region 126 of the black matrix 120 shown in the section (a) of FIG. 8 has thermal conductivity equivalent to the thermal conductivity of the black matrix shown in the section (a) of FIG. 6. It should be noted that there is no difference in arrangement of the red, green and blue emission regions among FIGS. 6 to 8.

Sections (b) of FIGS. 6 to 8 show numerical settings used for the simulations of the temperature distributions. The numbers of "0.1" are assigned to the red emission regions. The numbers of "0.07" are assigned to the green emission regions. The numbers of "1.6" are assigned to the blue emission regions. The numbers of "0" are assigned to regions in which the black matrices are situated. These values mean heat amounts in respective regions. It should be noted that there is no difference in the numerical settings in the sections (b) among FIGS. 6 to 8.

Sections (c) of FIGS. 6 to 8 show simulation results. The sections (c) of FIGS. 6 to 8 are temperature contour maps resulting from the simulations under the aforementioned conditions. The temperature distributions are described with reference to the sections (c) of FIGS. 6 to 8. The temperature distributions are drawn by temperature contours of which intervals are "2° C.".

According to the simulation result shown in the section (c) of FIG. 6, the highest temperature region was caused in correspondence to the blue emission region (the central region). The temperature fell with the increasing distance from the blue emission region. The lowest temperature region was caused in correspondence to the green emission region away from the blue emission region. A difference in temperature between the highest and lowest temperature regions was 14.3° C.

According to the simulation result shown in the section (c) of FIG. 7, the highest temperature region was caused in correspondence to the blue emission region (the central region). The temperature fell with the increasing distance from the blue emission region. The lowest temperature region was caused in correspondence to the green emission region away from the blue emission region. A difference in temperature between the highest and lowest temperature regions was 12.0° C.

According to the simulation result shown in the section (c) of FIG. 8, the highest temperature region was caused in correspondence to the blue emission region (the central region). The temperature fell with the increasing distance from the blue emission region. The lowest temperature region was caused in correspondence to the green emission region away from the blue emission region. A difference in temperature between the highest and lowest temperature regions was 6.2° C.

Specifically, the temperature in the highest temperature region shown in the section (c) of FIG. 7 is 6.1° C. lower than the temperature in the highest temperature region shown in the section (c) of FIG. 6. The temperature in the highest temperature region shown in the section (c) of FIG. 8 is 9.9° C. lower than the temperature in the highest temperature region shown in the section (c) of FIG. 6.

It is figured out from the results that the temperature of the entire display panel 100 may be reduced if the carbon nanotubes with high thermal conductivity are distributed only around the blue emission region without distribution of the carbon nanotubes over the entire black matrix 120. Since the highest temperature shown in the section (c) of FIG. 8 is lower than the highest temperature shown in the section (c) of FIG. 7, it is figured out that connection between the first conductive region 125 and the heat radiation member (the contact member 150 and the radiation layer 160) contributes to a reduction in the highest temperature of the display panel 100. Therefore, the principles of the present embodiment contribute to effective suppression of the temperature of the display panel 100 and reduction in usage of thermally conductive materials which are relatively expensive.

In the present embodiment, the temperature distribution of the display panel 100 is controlled by a filling rate of the thermally conductive materials loaded around the openings 121, which are formed in the black matrix 120. Therefore, it is unnecessary to provide a thermally conductive layer separately from the black matrix 120. Consequently, a component count of the display panel 100 decreases, so that the display panel 100 is structurally simplified.

<Second Embodiment>

Figure 9:
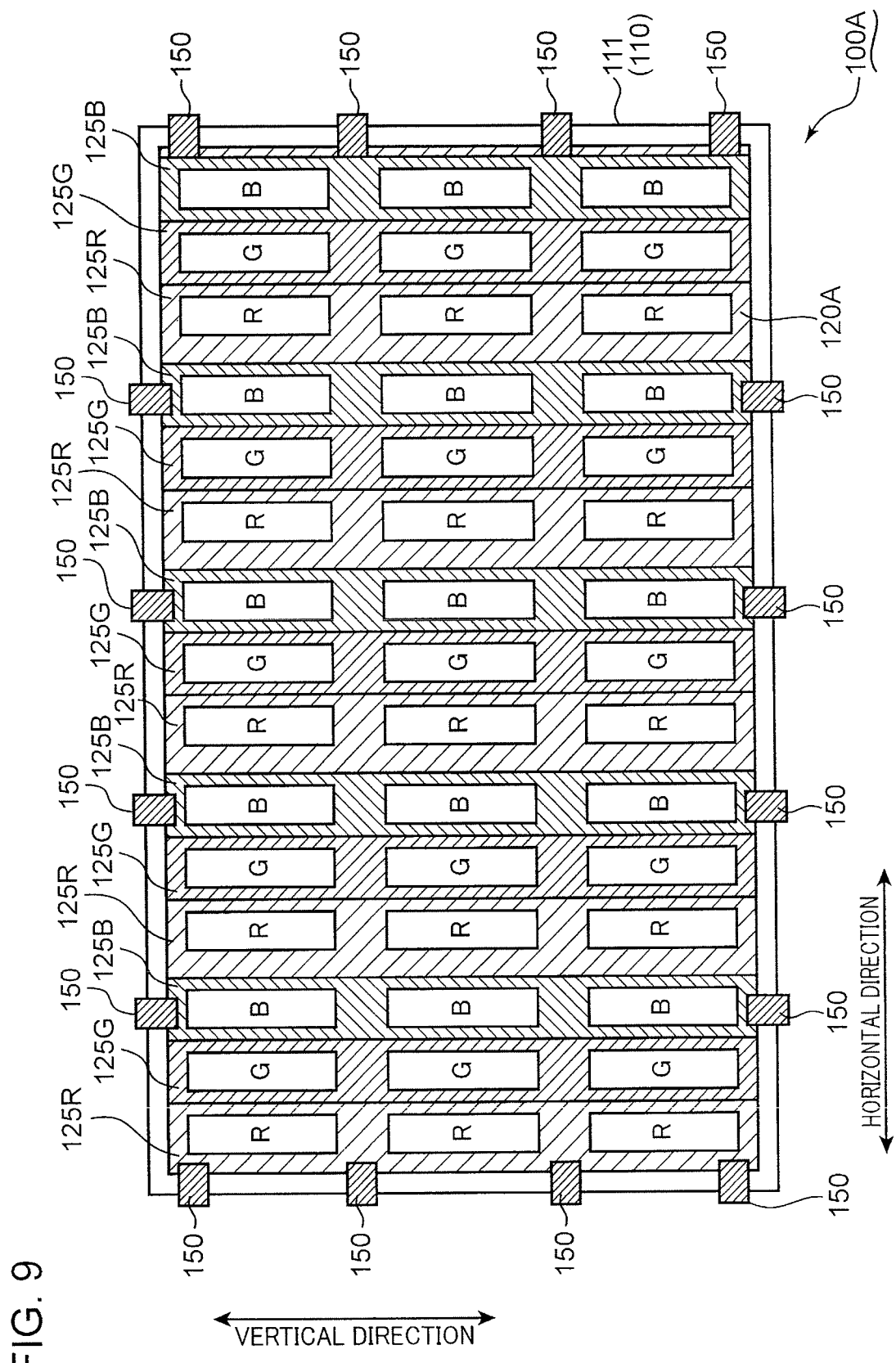
FIG. 9 is a schematic plan view of a display panel according to the second embodiment.

FIG. 9 is a schematic plan view of a display panel 100A according to the second embodiment. The display panel 100A is described with reference to FIG. 9. It should be noted that the same reference numerals and signs are given to the same components as components of the display panel 100 according to the first embodiment. Description about the common components with the first embodiment is omitted. Differences from the display panel 100 according to the first embodiment are described.

Some of the organic EL emission elements are likely to deteriorate because of characteristics that their heat generation amounts are susceptible to heat from other organic EL emission elements. In the present embodiment, organic EL emission elements situated in the green emission regions are exemplified as the elements with such characteristics. The organic EL emission elements situated in the green emission region have emission efficiency more susceptible to heat (deteriorate with time) than organic emission elements situated in the red emission regions have.

The display panel 100A includes the organic EL board 110 and a black matrix 120A facing the organic EL board 110.

The black matrix 120A includes blue conductive regions 125B formed around the blue emission regions, red conductive regions 125R formed around the red emission regions, and green conductive regions 125G formed around the green emission regions. The blue conductive regions 125B correspond to the first conductive regions 125 described in the context of the first embodiment. The red conductive regions 125R are closer to the red emission regions than the blue and/or green emission regions. The green conductive regions 125G are closer to the green emission regions than the blue and/or red emission regions.

The thermal conductivity of the green conductive regions 125G around the green emission regions is set higher than the thermal conductivity of the red conductive regions 125R around the red emission regions and lower than the thermal conductivity of the blue conductive regions 125B around the blue emission regions. A difference in thermal conductivity among the green, red and blue conductive regions 125G, 125R, 125B may be determined by a filling rate of materials with high thermal conductivity such as carbon nanotubes, as described in the context of the first embodiment.

The principles of the second embodiment contribute to suppression of deterioration of not only the blue emission elements 140B in the blue emission regions but also the green emission elements 140G in the green emission regions and reduction in usage of thermally conductive materials which are relatively expensive.

<Third Embodiment>

Figure 10:
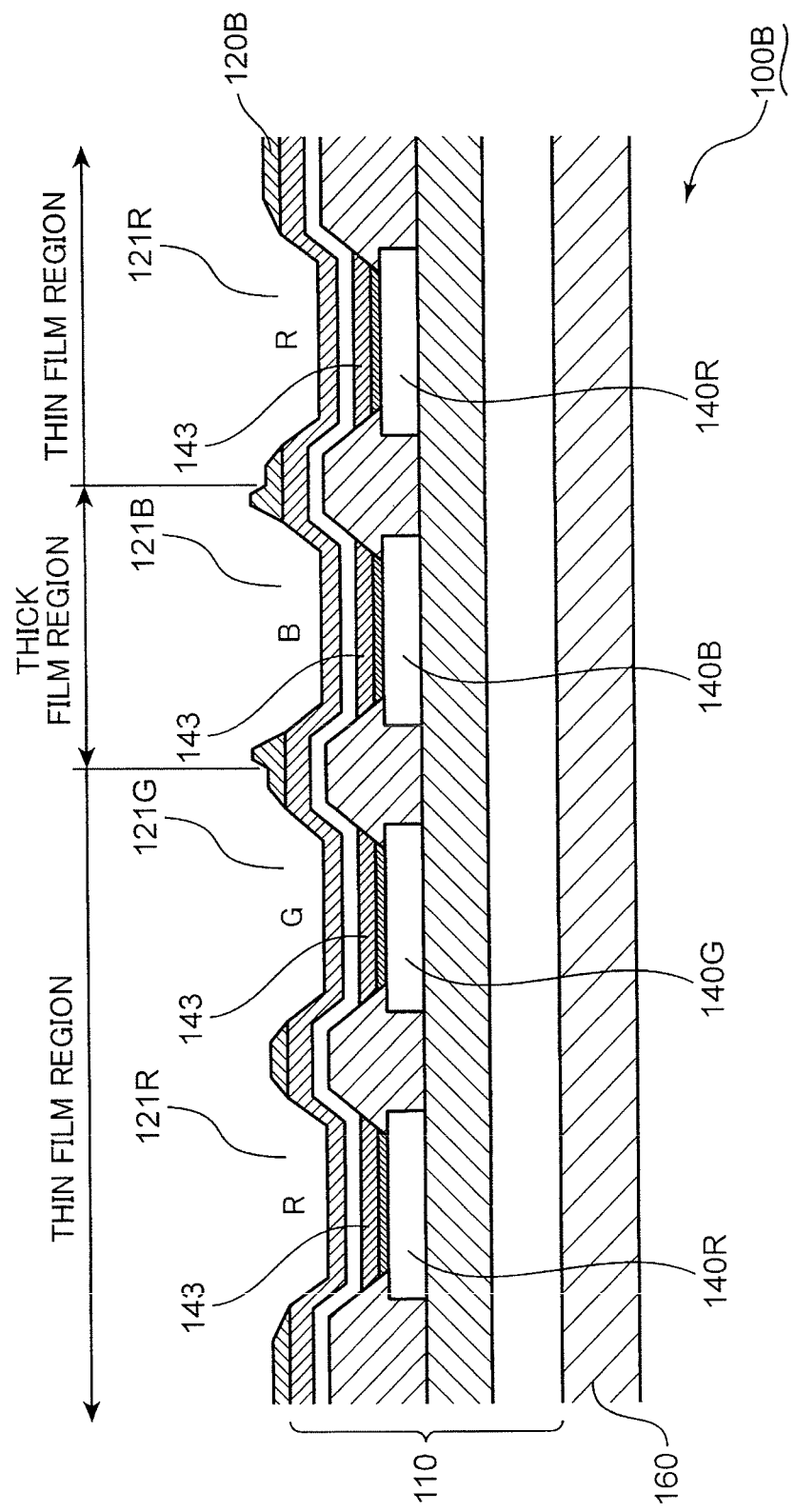
FIG. 10 is a schematic cross-sectional view of a display panel according to the third embodiment.

FIG. 10 is a schematic sectional view of the display panel 100B in the third embodiment. The display panel 100B is described with reference to FIG. 10. It should be noted that the same reference numerals and signs are given to the same components as components of the display panel 100 according to the first embodiment. Description about the common components with the first embodiment is omitted. Differences from the display panel 100 according to the first embodiment are described.

The display panel 100B includes the organic EL board 110, a black matrix 120B facing the organic EL board 110, and the radiation layer 160.

The black matrix 120B is provided with red openings 121R in correspondence to the organic emission layers 143 of the red emission elements 140R, green openings 121G in correspondence to the organic emission layers 143 of the green emission elements 140G, and blue openings 121B in correspondence to the organic emission layers 143 of the blue emission elements 140B. Light from the organic emission layers 143 of the red emission elements 140R is irradiated from the display panel 100B through the red openings 121R. Light from the organic emission layers 143 of the green emission elements 140G is irradiated from the display panel 100B through the green openings 121G. Light from the organic emission layers 143 of the blue emission elements 140B is irradiated from the display panel 100B through the blue openings 121B.

The black matrix 120B is uniformly loaded with materials having high thermal conductivity. Alternatively, the materials with high thermal conductivity may be intensively loaded around the blue openings, like the first embodiment.

The black matrix 120B includes thick film regions formed around the blue openings 121B and thin film regions formed around the red and green openings 121R, 121G. The black matrix 120B is thicker in the thick film regions than the thin film regions. In the present embodiment, the blue opening 121B is exemplified as the first opening section. The red and green openings 121R, 121G are exemplified as the second opening section.

The thermal conductivity of the black matrix 120B depends on not only the materials with high thermal conductivity but also the thickness dimension of the black matrix 120B. The black matrix 120B is the thickest around the blue openings 121B. Therefore, heat may be conducted effectively from the blue emission elements 140B.

Accordingly, the materials with high thermal conductivity do not have to have as high thermal conductivity as carbon nanotubes. In the present embodiment, the thermal conductivity of the materials with high thermal conductivity loaded in the black matrix 120B is preferably no less than 80 W/m·K. Carbon and chrome are exemplified as such thermally conductive materials.

In the present embodiment, a temperature distribution of the display panel 100B is controlled according to the thickness of the black matrix 120B. Therefore, it is unnecessary to provide a thermally conductive layer separately from the black matrix 120B. Consequently, a component count of the display panel 100B decreases, so that the display panel 100B is structurally simplified.

<Fourth Embodiment>

Figure 11:
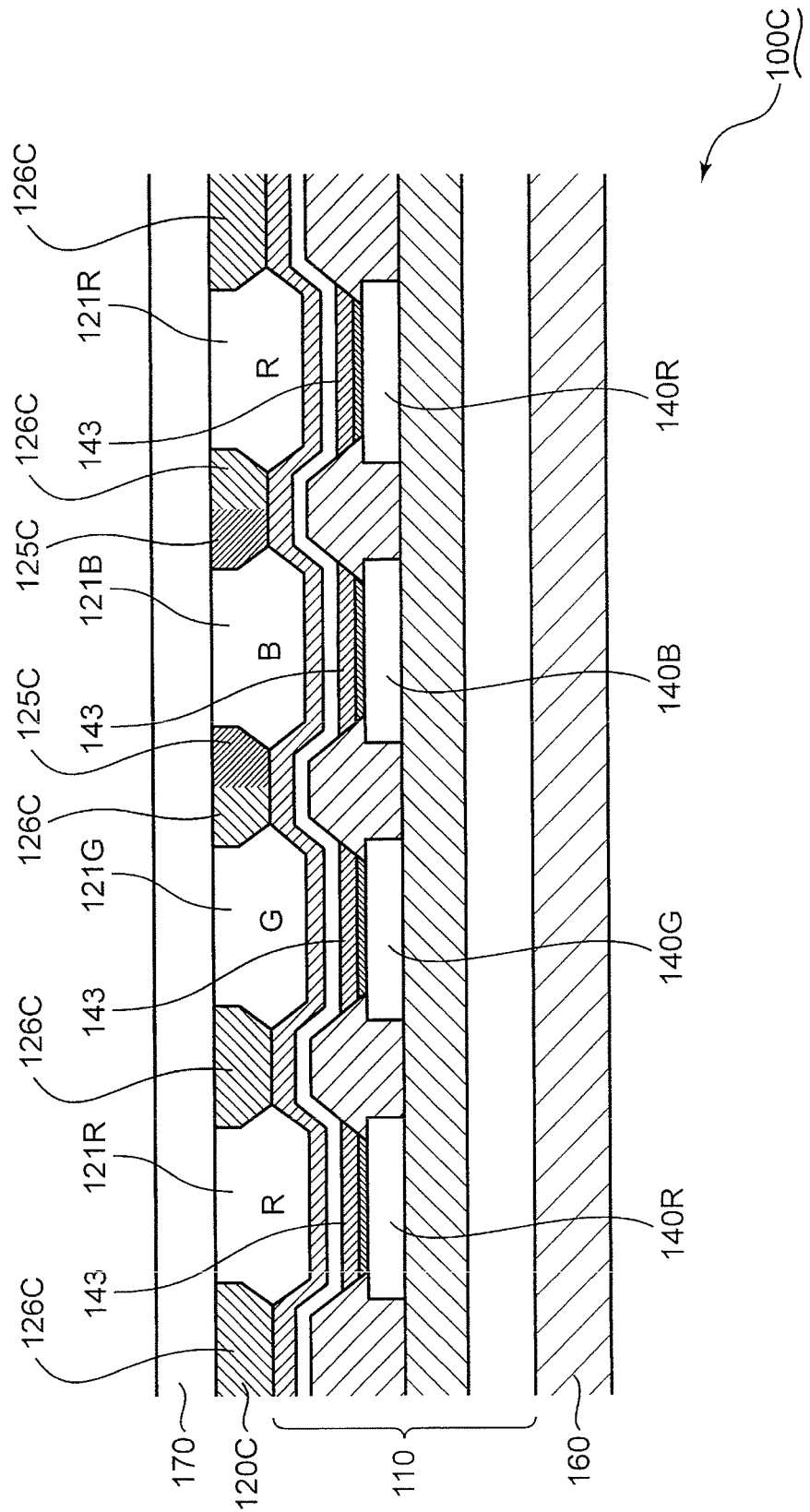
FIG. 11 is a schematic cross-sectional view of a display panel according to the fourth embodiment.

FIG. 11 is a schematic sectional view of a display panel 100C according to the fourth embodiment. The display panel 100C is described with reference to FIG. 11. It should be noted that the same reference numerals and signs are given to the same components as components of the display panel 100 according to the first embodiment. Description about the common components with the first embodiment is omitted. Differences from the display panel 100 according to the first embodiment are described.

The display panel 100C includes the organic EL board 110, a facing board 170, which faces the organic EL board 110, a black matrix 120C formed on the facing board 170, and the radiation layer 160.

The black matrix 120C is provided with the red openings 121R in correspondence to the organic emission layers 143 of the red emission elements 140R, the green openings 121G in correspondence to the organic emission layers 143 of the green emission elements 140G, and the blue openings 121B in correspondence to the organic emission layers 143 of the blue emission elements 140B. Light from the organic emission layers 143 of the red emission elements 140R is irradiated from the display panel 100C through the red openings 121R and the facing board 170. Light from the organic emission layers 143 of the green emission elements 140G is irradiated from the display panel 100C through the green openings 121G and the facing board 170. Light from the organic emission layers 143 of the blue emission elements 140B is irradiated from the display panel 100C through the blue openings 121B and the facing board 170.

The black matrix 120C includes first conductive regions 125C with high thermal conductivity and second conductive regions 126C which have lower thermal conductivity than the first conductive regions 125C do. Materials with high thermal conductivity such as carbon nanotubes are loaded into the first conductive regions 125C. The materials with high thermal conductivity are not loaded into the second conductive regions 126C. Alternatively, the materials with high thermal conductivity may be loaded into the second conductive regions 126C at a filling rate smaller than a filling rate in the first conductive regions 125C. Like the first embodiment, the first conductive regions 125C are preferably connected to the radiation layer 160 via a contact member (not shown in the figure).

Figure 12:
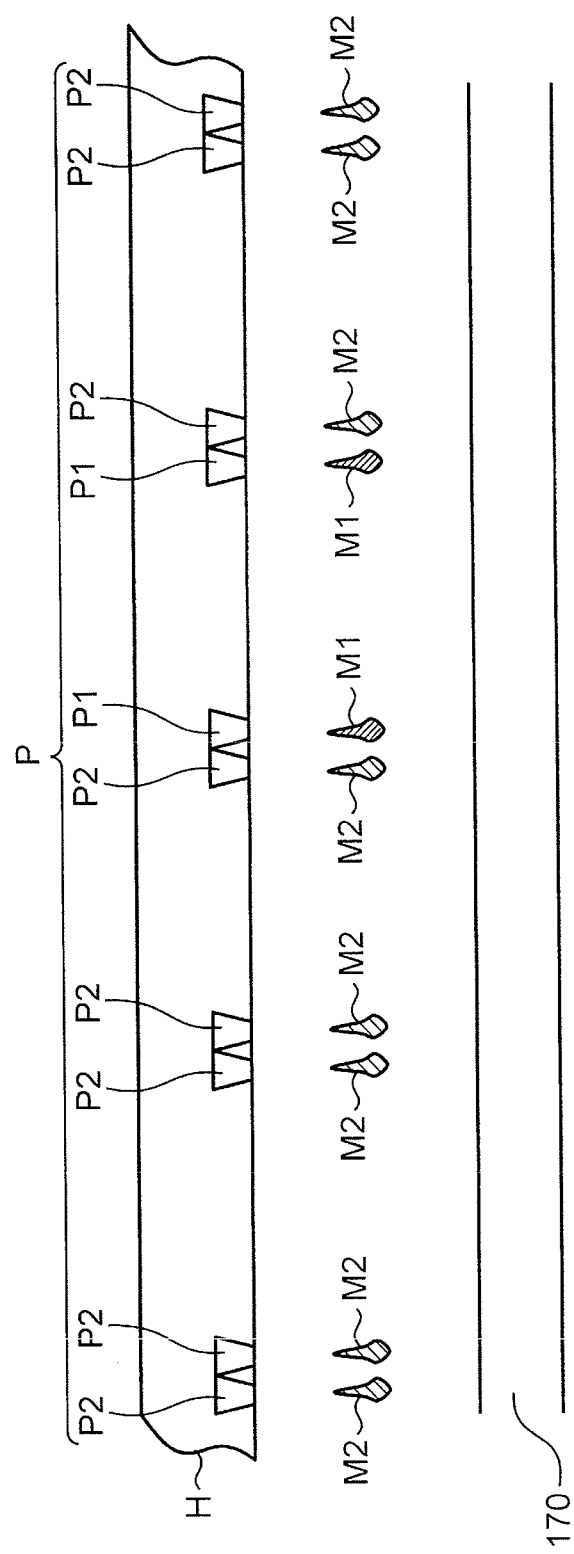
FIG. 12 is a schematic view showing a formation process of a black matrix of the display panel depicted in FIG. 11.

FIG. 12 is a schematic diagram of a formation process for the black matrix 120C. The formation process for the black matrix 120C is described with reference to FIGS. 11 and 12.

The black matrix 120C is formed on the facing board 170 by an inkjet device. FIG. 12 shows a head H of the inkjet device.

The head H is provided with discharge apertures P configured to discharge graphite resin materials used for formation of the black matrix 120C. The discharge apertures P include the first discharge apertures P1 for forming the black matrix 120C in the first conductive regions 125C and the second discharge apertures P2 for forming the black matrix 120C in the second conductive regions 126C. The graphite resin materials M1 of the black matrix 120C discharged from the first discharge apertures P1 include a larger amount of materials with high thermal conductivity (e.g. carbon nanotubes) than the graphite resin materials M2 of the black matrix 120C discharged from the second discharge apertures P2. Therefore, the thermal conductivity becomes higher in the first conductive regions 125C around the blue openings 121B than the second conductive regions 126C around the red and green openings 121R, 121G.

The black matrix is formed if the graphite resin materials M1, M2 cure on the facing board 170. The facing board 170 and the black matrix 120C are then superimposed on the organic EL board 110 to complete the display panel 100C.

<Fifth Embodiment>

Figure 13:
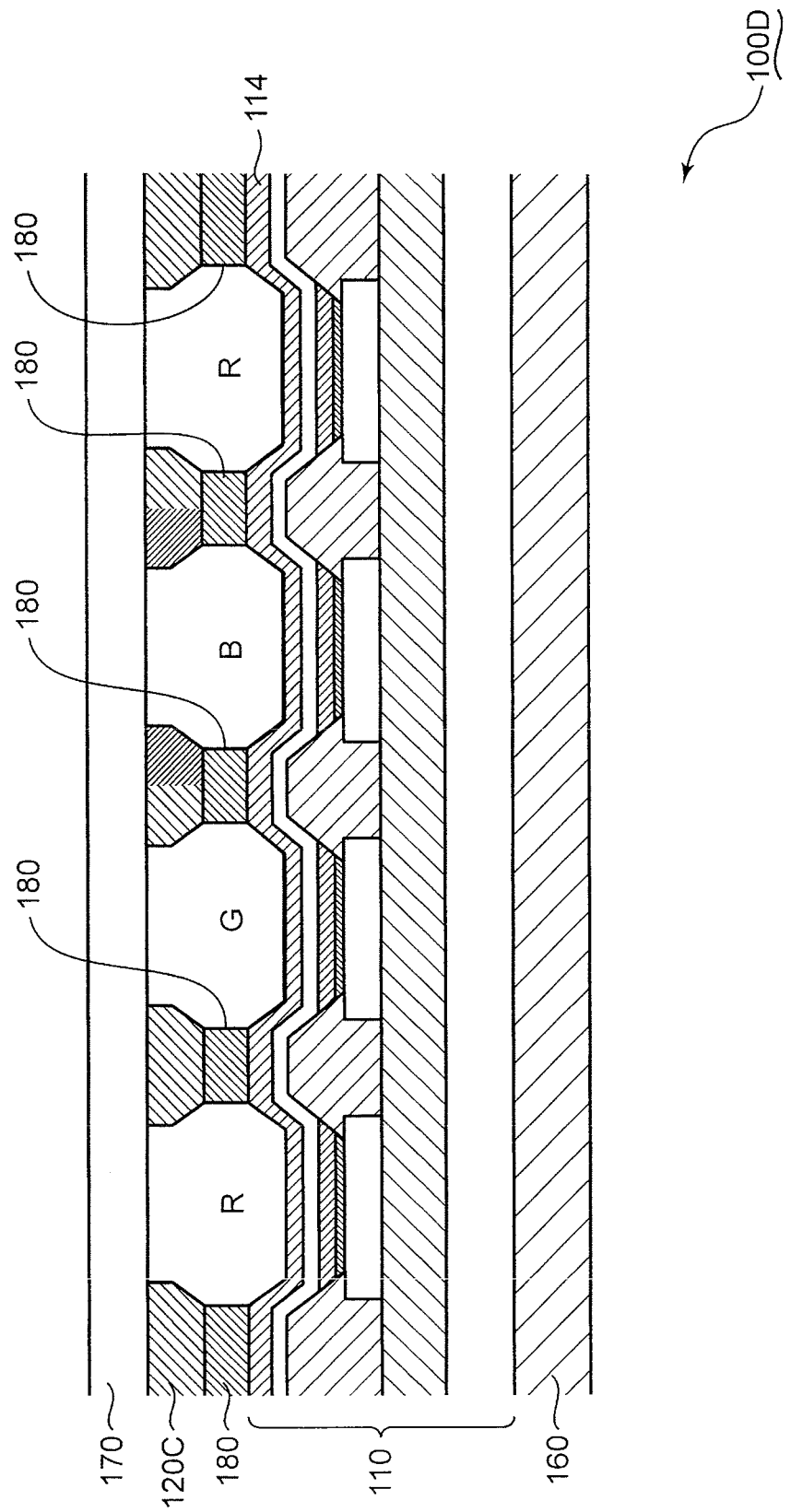
FIG. 13 is a schematic cross-sectional view of a display panel according to the fifth embodiment.

FIG. 13 is a schematic sectional view of a display panel 100D according to the fifth embodiment. The display panel 100D is described with reference to FIG. 13. It should be noted that the same reference numerals and signs are given to the same components as components of the display panels 100, 100C according to the first and fourth embodiments. Description about the common components with the first and/or fourth embodiments is omitted. Differences between the display panel 100D according to the fifth embodiment and the display panel(s) 100, 100C in the first and/or fourth embodiments are described.

The display panel 100D includes the organic EL board 110, the facing board 170 facing the organic EL board 110, the black matrix 120C formed on the facing board 170, a thermally conductive metal layer 180 situated between the black matrix 120C and the transparent cathode 114 of the organic EL board 110, and the radiation layer 160. Like the first and fourth embodiments, the black matrix 120C is connected to the radiation layer 160 via the contact member (not shown in the figure). The contact member is also in contact with the metal layer 180 to facilitate conduction of heat conducted by the metal layer 180 to the radiation layer 160. The radiation layer 160 emits the heat outside the display panel 100D.

In the present embodiment, the thermal conductivity of the metal layer 180 is preferably no less than 200 W/m·K. Aluminum, copper or silver is exemplified as such a metal material. In the present embodiment, the metal layer 180 may be used as not only the thermally conductive layer but also a wire for supplying electric power and signals to the display panel 100D.

<Sixth Embodiment>

In the series of embodiments, the thermal conductivity of the black matrix is locally increased, so that a temperature rise is effectively suppressed. Such suppression principles against a temperature rise are also applied to components other than the black matrix.

Figure 14:
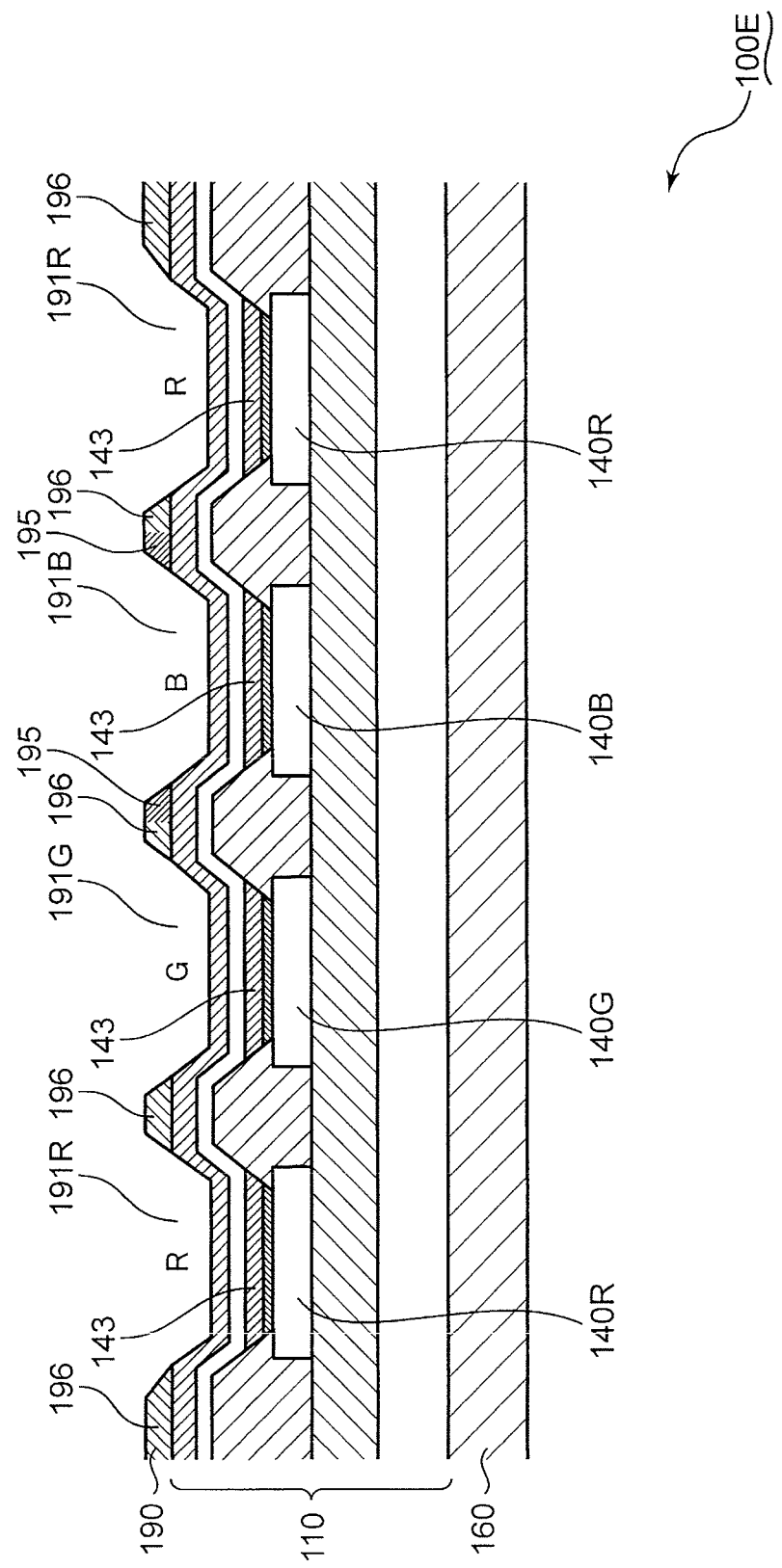
FIG. 14 is a schematic cross-sectional view of a display panel according to the sixth embodiment.

FIG. 14 is a schematic sectional view of a display panel 100E according to the sixth embodiment. The display panel 100E is described with reference to FIG. 14. It should be noted that the same reference numerals and signs are given to the same components as components of the display panel 100 according to the first embodiment. Description about the common components with the first embodiment is omitted. Differences from the display panel 100 according to the first embodiment are described.

The display panel 100E includes the organic EL board 110, a thermally conductive layer 190 facing the organic EL board 110, and the radiation layer 160. A facing board (not shown in the figure), on which a black matrix (not shown in the figure) is formed, is set on the thermally conductive layer 190 to complete the display panel 100E.

The thermally conductive layer 190 is provided with red openings 191R in correspondence to the organic emission layers 143 of the red emission elements 140R, green openings 191G in correspondence to the organic emission layers 143 of the green emission elements 140G, and blue openings 191B in correspondence to the organic emission layers 143 of the blue emission elements 140B. Light from the organic emission layers 143 of the red emission elements 140R is irradiated from the display panel 100E through the red openings 191R. Light from the organic emission layers 143 of the green emission elements 140G is irradiated from the display panel 100E through the green openings 191G. Light from the organic emission layers 143 of the blue emission elements 140B is irradiated from the display panel 100E through the blue openings 191B.

The thermally conductive layer 190 includes first conductive regions 195 with high thermal conductivity and second conductive regions 196 which have lower thermal conductivity than the first conductive regions 195 do. Materials with high thermal conductivity such as carbon nanotubes are loaded into the first conductive regions 195. The materials with high thermal conductivity are not loaded in the second conductive regions 196. Alternatively, the materials with high thermal conductivity is loaded in the second conductive regions 196 at a filling rate smaller than the filling rate in the first conductive regions 195. Like the first embodiment, the first conductive regions 195 are preferably connected to the radiation layer 160 via a contact member (not shown in the figure). In the present embodiment, the first conductive region 195 is exemplified as the first region. The second conductive region 196 is exemplified as the second region.

In the present embodiment, the thermally conductive layer 190 causes the same thermal conductance action as the thermal conductance action of the black matrix 120 in the first embodiment. If the thermally conductive layer 190 is used as a black matrix for blocking light from the organic emission layers 143, the display panel 100E has a structure equivalent to the structure described in the context of the first embodiment.

<Display Device>

Figure 15:
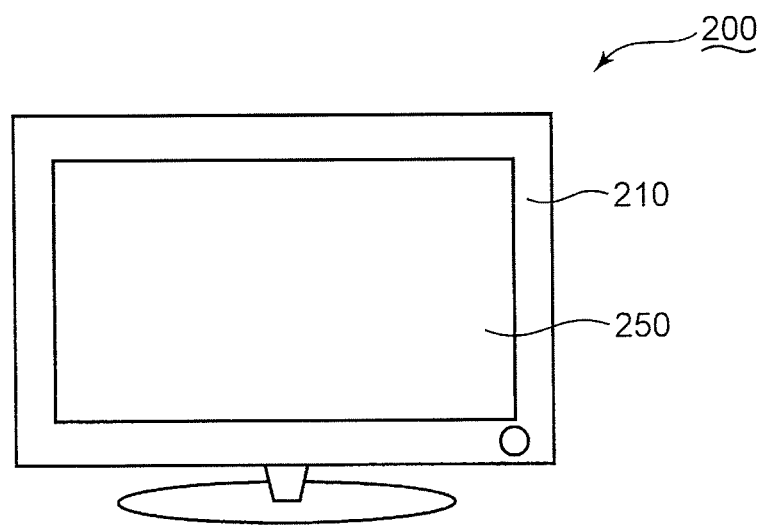
FIG. 15 is a schematic view of a display device into which one of the display panels according to the first to sixth embodiments is incorporated.

FIG. 15 is a schematic diagram of a display device 200 in which one of the display panels 100, 100A, 100B, 100C, 100D, 100E described in the context of the series of embodiments is incorporated. The display device 200 is described with reference to FIG. 15.

The display device 200 includes a display panel 250 and a housing 210 configured to support the display panel 250. It should be noted that the display panel 250 is any one of the display panels 100, 100A, 100B, 100C, 100D, 100E described in the context of the series of embodiments.

Various circuits and devices for causing the display panel 250 to display images are incorporated in the housing 210. As described above, the display panel 250 appropriately emits internal heat. Therefore, the display device 200 may display high quality images for a long time.

A television set, a display device of a personal computer, a cellular phone, and other devices configured to display images are exemplified as the display device 200.

The aforementioned embodiments mainly include the following features. An organic EL display panel and display device with the following features may effectively suppress a temperature rise over the entire organic EL display.

An organic EL display panel according to one aspect of the aforementioned embodiments includes an organic EL board including organic emission elements which are situated in respective emission regions compartmentalized by a confining wall, and a black matrix which faces the organic EL board. The black matrix is provided with openings, each of which allows passage of light from each of the organic emission elements. The organic emission elements include a first organic emission element with an organic emission layer configured to emit light in first emission color, and a second organic emission element with an organic emission layer configured to emit light in second emission color which is different from the first emission color. The openings include a first opening in correspondence to the first organic emission element, and a second opening in correspondence to the second organic emission element. The first organic emission element has lower emission efficiency than the second organic emission element does. Thermal conductivity is higher around the first opening than the second opening.

According to the aforementioned configuration, the organic EL board includes organic emission elements situated in respective emission regions compartmentalized by the confining wall. The black matrix facing the organic EL board is provided with openings, each of which allows passage of light from each of the organic emission elements. The organic emission elements include a first organic emission element with an organic emission layer configured to emit light in first emission color, and a second organic emission element with an organic emission layer configured to emit light in second emission color which is different from the first emission color. The openings include a first opening in correspondence to the first organic emission element, and a second opening in correspondence to the second organic emission element. Since the first organic emission element has lower emission efficiency than the second organic emission element does, the first organic emission element is likely to cause more heat than the second organic emission element is. However, since thermal conductivity is higher around the first opening than the second opening, heat from the first organic emission element is conducted effectively. Therefore, a temperature rise is effectively suppressed over the entire organic EL display panel.

In the aforementioned configuration, it is preferable that the first organic emission element is a blue emission element configured to emit light in blue.

According to the aforementioned configuration, the first organic emission element is a blue emission element configured to emit light in blue. In general, an organic emission layer configured to emit light in blue is inferior to other organic emission layers configured to emit light in different hue in terms of luminance and/or life time. In the aforementioned configuration, since the thermal conductivity around the first opening in correspondence to the blue emission element is higher than the thermal conductivity around the second opening, heat from the blue emission element is effectively conducted. Therefore, a temperature rise is effectively suppressed over the entire organic EL display panel.

In the aforementioned configuration, it is preferable that the organic emission elements include a blue emission element configured to emit light in blue, a red emission element configured to emit light in red, and a green emission element configured to emit light in green. The first organic emission element may be the blue emission element. The second organic emission element may be the red emission element or the green emission element.

According to the aforementioned configuration, the organic emission elements include a blue emission element configured to emit light in blue, a red emission element configured to emit light in red, and a green emission element configured to emit light in green. The first organic emission element is the blue emission element. The second organic emission element is the red emission element or the green emission element. In general, an organic emission layer configured to emit light in blue is inferior to another organic emission layer configured to emit light in red or green in terms of luminance and/or life time. In the aforementioned configuration, since the thermal conductivity around the first opening in correspondence to the blue emission element is higher than the thermal conductivity around the second opening, heat from the blue emission element is effectively conducted. Therefore, a temperature rise is effectively suppressed over the entire organic EL display panel.

In the aforementioned configuration, it is preferable that the organic emission elements include a third organic emission element with an organic emission layer configured to emit light in third emission color which is different from both of the first emission color and the second emission color. The openings may include a third opening in correspondence to the third organic emission element. Emission efficiency of the third organic emission element may be more susceptible to heat than emission efficiency of the second organic emission element is. The thermal conductivity may be higher around the third opening than the second opening but lower around the third opening than the first opening.

According to the aforementioned configuration, the organic emission elements include a third organic emission element with an organic emission layer configured to emit light in third emission color which is different from both of the first emission color and the second emission color. The openings include a third opening in correspondence to the third organic emission element. Since the thermal conductivity may be higher around the third opening than the second opening, heat becomes less influential in the emission efficiency of the third organic emission element although the emission efficiency of the third organic emission element is more susceptible to heat than emission efficiency of the second organic emission element is.

In the aforementioned configuration, it is preferable that the organic emission elements include a blue emission element configured to emit light in blue, a red emission element configured to emit light in red, and a green emission element configured to emit light in green. The emission efficiency of the first organic emission element may be lower than the emission efficiency of the third organic emission element is. The first organic emission element may be a blue emission element configured to emit light in blue. The second organic emission element may be a red emission element configured to emit light in red. The third organic emission element may be a green emission element configured to emit light in green. The thermal conductivity may be lower around the third opening than the first opening.

According to the aforementioned configuration, the first organic emission element is a blue emission element configured to emit light in blue. The second organic emission element is a red emission element configured to emit light in red. The third organic emission element is a green emission element configured to emit light in green. Since the thermal conductivity is higher around the first opening than the second and third openings, heat from the blue emission element is effectively conducted although the emission efficiency of the blue emission element is lower than each of the emission efficiencies of the red and green emission elements. Therefore, a temperature rise is effectively suppressed over the entire organic EL display panel. In addition, since the thermal conductivity is higher around the third opening than the second opening although the thermal conductivity is lower around the third opening than the first opening, heat becomes less influential in the emission efficiency of the green organic emission element.

In the aforementioned configuration, it is preferable that the black matrix contains thermally conductive materials loaded around the openings. A filling rate of the thermally conductive materials may be higher around the first opening than the second opening.

According to the aforementioned configuration, the black matrix contains thermally conductive materials loaded around the openings. Since a filling rate of the thermally conductive materials is higher around the first opening than the second opening, the thermal conductivity becomes higher around the first opening than the second opening. Therefore, a temperature rise is effectively suppressed over the entire organic EL display panel.

In the aforementioned configuration, it is preferable that the thermally conductive materials have thermal conductivity no less than 1,000 W/m·K.

According to the aforementioned configuration, since the thermally conductive materials have thermal conductivity no less than 1,000 W/m·K, a temperature rise is effectively suppressed over the entire organic EL display panel.

In the aforementioned configuration, it is preferable that the thermally conductive materials include carbon nanotubes.

According to the aforementioned configuration, since the thermally conductive materials include carbon nanotubes, a temperature rise is effectively suppressed over the entire organic EL display panel.

In the aforementioned configuration, it is preferable that the black matrix is provided with a travelling path which allows passage of a laser beam for repair.

According to the aforementioned configuration, since the black matrix is provided with a travelling path which allows passage of a laser beam for repair, it becomes easy to remove foreign objects between the black matrix and the organic EL board.

In the aforementioned configuration, it is preferable that the organic EL display panel further includes a thermally conductive metal layer formed around the first opening, and a heat dissipater configured to emit heat, which is conducted by the metal layer, to the outside. The metal layer may be connected to the heat dissipater.

According to the aforementioned configuration, the organic EL display panel further includes a thermally conductive metal layer formed around the first opening, and a heat dissipater configured to emit heat, which is conducted by the metal layer, to the outside. Since the metal layer is connected to the heat dissipater, a temperature rise is effectively suppressed over the entire organic EL display panel.

In the aforementioned configuration, it is preferable that the metal layer has thermal conductivity no less than 200 W/m·K.

According to the aforementioned configuration, since the metal layer has thermal conductivity no less than 200 W/m·K, a temperature rise is effectively suppressed over the entire organic EL display panel.

In the aforementioned configuration, it is preferable that the metal layer includes at least one of metal materials selected from a group consisting of aluminum, copper and silver.

According to the aforementioned configuration, since the metal layer includes at least one of metal materials selected from a group consisting of aluminum, copper and silver, a temperature rise is effectively suppressed over the entire organic EL display panel.

In the aforementioned configuration, it is preferable that the black matrix contains thermally conductive materials loaded around the openings. The black matrix may be thicker around the first opening than the second opening.

According to the aforementioned configuration, the black matrix contains thermally conductive materials loaded around the openings. Since the black matrix is thicker around the first opening than the second opening, it may be easy to set higher thermal conductivity around the first opening than the second opening.

In the aforementioned configuration, it is preferable that the thermally conductive materials have thermal conductivity no less than 80 W/m·K.

According to the aforementioned configuration, since the thermally conductive materials have thermal conductivity no less than 80 W/m·K, a temperature rise is effectively suppressed over the entire organic EL display panel.

In the aforementioned configuration, it is preferable that the thermally conductive materials include at least one of materials selected from a group consisting of carbon and chrome.

According to the aforementioned configuration, since the thermally conductive materials include at least one of materials selected from a group consisting of carbon and chrome, a temperature rise is effectively suppressed over the entire organic EL display panel.

In the aforementioned configuration, it is preferable that the organic EL display panel further includes a heat dissipater configured to emit heat outside from the black matrix. The black matrix may be connected to the heat dissipater.

According to the aforementioned configuration, the organic EL display panel further includes a heat dissipater configured to emit heat outside from the black matrix. Since the black matrix is connected to the heat dissipater, a temperature rise is effectively suppressed over the entire organic EL display panel.

An organic EL display panel according to another aspect of the aforementioned embodiments includes organic emission elements which are situated in respective emission regions compartmentalized by a confining wall, and a thermally conductive layer formed on the confining wall. The organic emission elements include a first organic emission element with an organic emission layer configured to emit light in first emission color, and a second organic emission element with an organic emission layer configured to emit light in second emission color which is different from the first emission color. The thermally conductive layer is loaded with thermally conductive materials. The thermally conductive layer includes a first region closer to the first organic emission element than the second organic emission element, and a second region closer to the second organic emission element than the first organic emission element. A filling rate of the thermally conductive materials is higher in the first region than the second region.

According to the aforementioned configuration, the organic emission elements are situated in respective emission regions which are compartmentalized by the confining wall. The thermally conductive layer is formed on the confining wall. The organic emission elements include a first organic emission element with an organic emission layer configured to emit light in first emission color, and a second organic emission element with an organic emission layer configured to emit light in second emission color which is different from the first emission color. The thermally conductive layer loaded with thermally conductive materials includes a first region closer to the first organic emission element than the second organic emission element, and a second region closer to the second organic emission element than the first organic emission element. Since a filling rate of the thermally conductive materials is higher in the first region than the second region, heat from the first organic emission element is effectively conducted. Therefore, a temperature rise is effectively suppressed over the entire organic EL display panel.

In the aforementioned configuration, it is preferable that the thermally conductive layer is a black matrix.

According to the aforementioned configuration, since the thermally conductive layer does not only cause thermal conduction effect but also is used as a black matrix, the organic EL display panel may be thinned.

A display device according to another aspect of the aforementioned embodiments includes the aforementioned organic EL display panel.

According to the aforementioned configuration, since the display device includes the organic EL display panel, the display device may display images without an excessive temperature rise. Therefore, the display device may display good quality images for a long time.

Industrial Applicability

The principles of the aforementioned embodiments may be suitably applied to apparatuses which use organic emission elements to display images.

The invention claimed is:

1. An organic electroluminescence display panel, comprising:
   an organic electroluminescence board including organic emission elements which are situated in emission regions, respectively, the emission regions compartmentalized by a confining wall, and
   a black matrix which faces the organic electroluminescence board,
   wherein the black matrix is provided with openings, each of which allows passage of light from each of the organic emission elements,
   wherein the organic emission elements include a first organic emission element with an organic emission layer configured to emit light in first emission color, and a second organic emission element with an organic emission layer configured to emit light in second emission color which is different from the first emission color,
   wherein the openings include a first opening in correspondence to the first organic emission element, and a second opening in correspondence to the second organic emission element,
   wherein the first organic emission element has lower emission efficiency than the second organic emission element does, and
   wherein thermal conductivity is higher around the first opening than the second opening.

2. The organic electroluminescence display panel according to claim 1,
   wherein the first organic emission element is a blue emission element configured to emit light in blue.

3. The organic electroluminescence display panel according to claim 1,
   wherein the organic emission elements include a blue emission element configured to emit light in blue, a red emission element configured to emit light in red, and a green emission element configured to emit light in green,
   wherein the first organic emission element is the blue emission element, and
   wherein the second organic emission element is the red emission element or the green emission element.

4. The organic electroluminescence display panel according to claim 1,
   wherein the organic emission elements include a third organic emission element with an organic emission layer configured to emit light in third emission color which is different from both of the first emission color and the second emission color,
   wherein the openings include a third opening in correspondence to the third organic emission element,
   wherein emission efficiency of the third organic emission element is more susceptible to heat than emission efficiency of the second organic emission element is, and
   wherein the thermal conductivity is higher around the third opening than the second opening.

5. The organic electroluminescence display panel according to claim 4,
   wherein the organic emission elements include a blue emission element configured to emit light in blue, a red emission element configured to emit light in red, and a green emission element configured to emit light in green,
   wherein the emission efficiency of the first organic emission element is lower than the emission efficiency of the third organic emission element is,
   wherein the first organic emission element is a blue emission element configured to emit light in blue,
   wherein the second organic emission element is a red emission element configured to emit light in red,
   wherein the third organic emission element is a green emission element configured to emit light in green, and
   wherein the thermal conductivity is lower around the third opening than the first opening.

6. The organic electroluminescence display panel according to claim 1,
   wherein the black matrix contains thermally conductive materials loaded around the openings, and
   wherein a filling rate of the thermally conductive materials is higher around the first opening than the second opening.

7. The organic electroluminescence display panel according to claim 6,
wherein the thermally conductive materials have thermal conductivity no less than 1,000 W/m·K.

8. The organic electroluminescence display panel according to claim 7,
wherein the thermally conductive materials include carbon nanotubes.

9. The organic electroluminescence display panel according to claim 8,
wherein the black matrix includes an allowance region which allows passage of a laser beam for repair.

10. The organic electroluminescence display panel according to claim 1, further comprising:
a thermally conductive metal layer formed around the first opening, and
a heat dissipater configured to emit heat outside, the heat conducted by the metal layer,
wherein the metal layer is connected to the heat dissipater.

11. The organic electroluminescence display panel according to claim 10,
wherein the metal layer has thermal conductivity no less than 200 W/m·K.

12. The organic electroluminescence display panel according to claim 11,
wherein the metal layer includes at least one of metal materials selected from a group consisting of aluminum, copper and silver.

13. The organic electroluminescence display panel according to claim 1,
wherein the black matrix contains thermally conductive materials loaded around the openings, and
wherein the black matrix is thicker around the first opening than the second opening 14. The organic electroluminescence display panel according to claim 13,
wherein the thermally conductive materials have thermal conductivity no less than 80 W/m·K.

15. The organic electroluminescence display panel according to claim 11,
wherein the thermally conductive materials include at least one of materials selected from a group consisting of carbon and chrome.

16. The organic electroluminescence display panel according to claim 1, further comprising:
a heat dissipater configured to emit heat outside from the black matrix,
wherein the black matrix is connected to the heat dissipater.

17. An organic electroluminescence display panel, comprising:
organic emission elements which are situated in emission regions, respectively, the emission regions compartmentalized by a confining wall, and
a thermally conductive layer formed on the confining wall,
wherein the organic emission elements include a first organic emission element with an organic emission layer configured to emit light in first emission color, and a second organic emission element with an organic emission layer configured to emit light in second emission color which is different from the first emission color,
wherein the thermally conductive layer is loaded with thermally conductive materials,
wherein the thermally conductive layer includes a first region closer to the first organic emission element than the second organic emission element, and a second region closer to the second organic emission element than the first organic emission element, and
wherein a filling rate of the thermally conductive materials is higher in the first region than the second region.

18. The organic electroluminescence display panel according to claim 17,
wherein the thermally conductive layer is a black matrix.

19. A display device comprising the organic electroluminescence display panel according to claims 1.

* * * * *